United States Patent
Casey et al.

(10) Patent No.: US 8,202,765 B2
(45) Date of Patent: Jun. 19, 2012

(54) ACHIEVING MECHANICAL AND THERMAL STABILITY IN A MULTI-CHIP PACKAGE

(75) Inventors: Jon A. Casey, Poughkeepsie, NY (US); John S. Corbin, Jr., Austin, TX (US); David Danovitch, Quebec (CA); Isabelle Depatie, Vancouver (CA); Virendra R. Jadhav, Wappingers Falls, NY (US); Roger A. Liptak, Hopewell Junction, NY (US); Kenneth C. Marston, Poughquag, NY (US); Jennifer V. Muncy, Ridgefield, CT (US); Sylvain Ouimet, Quebec (CA); Eric Salvas, Quebec (CA)

(73) Assignee: International Business Machines Corporation, Armonk, NY (US)

( * ) Notice: Subject to any disclaimer, the term of this patent is extended or adjusted under 35 U.S.C. 154(b) by 555 days.

(21) Appl. No.: 12/357,716

(22) Filed: Jan. 22, 2009

(65) Prior Publication Data

US 2010/0181665 A1 Jul. 22, 2010

(51) Int. Cl.
*H01L 21/44* (2006.01)
*H01L 21/48* (2006.01)

(52) U.S. Cl. . 438/122; 438/108; 438/118; 257/E23.101; 257/704

(58) Field of Classification Search .................. 438/122, 438/109; 257/704, 713, E23.101
See application file for complete search history.

(56) References Cited

U.S. PATENT DOCUMENTS

| | | | |
|---|---|---|---|
| 5,587,882 A | | 12/1996 | Patel |
| 5,604,978 A * | | 2/1997 | Sherif et al. ................. 29/840 |
| 5,819,402 A * | | 10/1998 | Edwards et al. ............. 29/840 |
| 5,847,929 A * | | 12/1998 | Bernier et al. .............. 361/719 |
| 5,956,576 A * | | 9/1999 | Toy et al. ..................... 438/125 |
| 5,981,310 A * | | 11/1999 | DiGiacomo et al. ........ 438/106 |
| 6,111,314 A * | | 8/2000 | Edwards et al. ............. 257/704 |
| 6,294,408 B1 * | | 9/2001 | Edwards et al. ............. 438/121 |
| 6,462,410 B1 * | | 10/2002 | Novotny et al. ............. 257/707 |
| 6,489,678 B1 | | 12/2002 | Joshi |
| 6,627,991 B1 | | 9/2003 | Joshi |
| 6,653,730 B2 * | | 11/2003 | Chrysler et al. ............. 257/704 |
| 6,992,384 B2 | | 1/2006 | Joshi |
| 7,031,162 B2 | | 4/2006 | Arvelo et al. |
| 7,035,113 B2 | | 4/2006 | Fraley et al. |
| 7,078,800 B2 * | | 7/2006 | Kwon et al. ................. 257/704 |
| 7,161,810 B2 | | 1/2007 | Fraley et al. |
| 7,256,067 B1 * | | 8/2007 | Too et al. ..................... 438/106 |
| 7,547,582 B2 * | | 6/2009 | Brunschwiler et al. ....... 438/123 |
| 7,906,057 B2 * | | 3/2011 | Zhang et al. ................. 264/284 |
| 2001/0026957 A1 * | | 10/2001 | Atwood et al. .............. 438/122 |

OTHER PUBLICATIONS

Becker et al., "Analysis and issues of developing a build-up laminate multi-chip-module", Electrical Performance of Electronic Packaging, 2005, pp. 143-146.
Arvelo et al., "Package cooling designs for a dual-chip electronic package with one high power chip", URL: http://cat.inist.fr/?aModele=afficheN&cpsidt=17808429. Nowak et al., "Large thin organic PTFE substrates for multichip applications", Electronic Components and Technology Conference, 2005, pp. 1359-1363, vol. 2.
Kim et al., "$2^{nd}$ and $3^{rd}$ Level Solder Joint Reliability of High-end Flip Chip System in Package (SiP)".
Ouimet et al., "Development of a 50mm Dual Flip Chip Plastic Land Grid Array Package for Server Applications", Presented in a conference on May 30, 2008.

* cited by examiner

*Primary Examiner* — Nitin Parekh
(74) *Attorney, Agent, or Firm* — Joe Petrokaitis; Roberts Mlotkowski Safran & Cole, P.C.

(57) ABSTRACT

A system and method system for achieving mechanical and thermal stability in a multi-chip package. The system utilizes a lid and multiple thermal interface materials. The method includes utilizing a lid on a multi-chip package and utilizing multiple thermal interface materials on the multi-chip package.

22 Claims, 8 Drawing Sheets

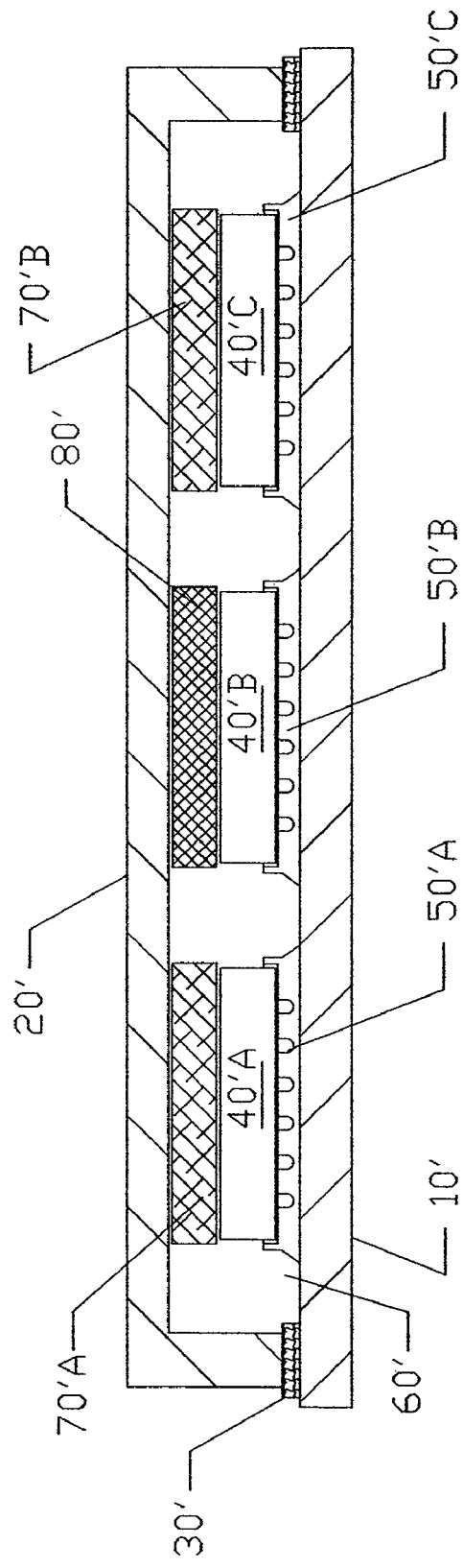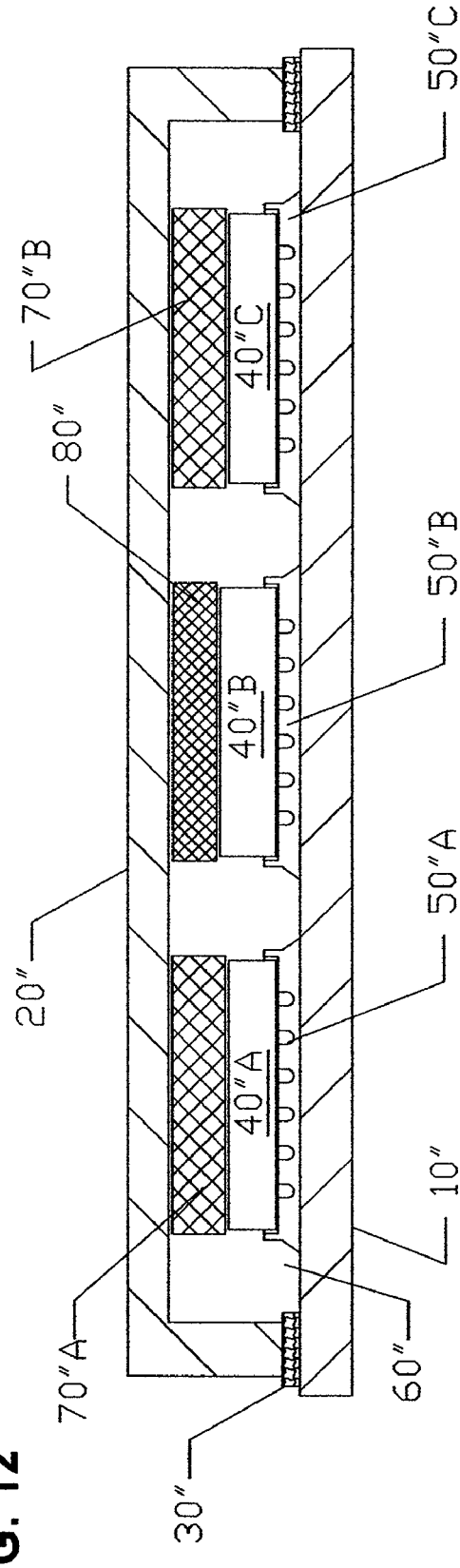

ACHIEVING MECHANICAL AND THERMAL STABILITY IN A MULTI-CHIP PACKAGE

FIELD OF THE INVENTION

The invention generally relates to a system and method for achieving mechanical and thermal stability in a multi-chip package utilizing a stepped lid and multiple thermal interface materials.

BACKGROUND

In organic chip packages, coefficient of thermal expansion (CTE) mismatch, i.e., the mismatch which occurs in the chip plus carrier system, can cause significant warping of the chip package. Typically, the mismatch can cause the package to flex substantially from temperature changes which occur during assembly and use. The flexing also results in, among other things, stresses and strains generated in the chips, in the underfill and laminate materials used in the package, and in the thermal interface material (TIM). CTE mismatch can also result in bottom surface metallurgy (BSM) non-coplanarity, and ball grid array (BGA) and land grid array (LGA) contact non-uniformity.

Multi-chip packages can exacerbate the warping and stress produced by CTE mismatch. These typically result from the additional silicon area of such packages, inherent asymmetries created in the packages, and the greater spans utilized between the silicon and lid seal area. Multi-chip packages also have thermal issues relating to TIM bond line control which result from multiple device heights.

High-end processor packages also suffer from CTE mismatch because they have more demanding thermal requirements requiring high power dissipation and multi-core chips with high heat flux areas. They also require thin bond line with high performance TIM.

Some current industry solutions for multi-chip organic packages include a dual chip LGA organic package with thick Indium TIM on both chips. This solution, however, is expensive. Another solution is a dual chip low-power package which utilizes different chip heights, a phase change material on both chips, and direct heat sink attachment without a module lid.

It is also notable that the difference in the coefficient of thermal expansion in organic module packages between the silicon (3 ppm) on the chip and the organic carrier, which is mainly copper with some thin organic layers, (15 ppm) is very high. When the silicon chip is essentially "locked in" to the carrier during the cure of the epoxy underfill (between 120° C. and 170° C.), the carrier is stretched out more than the silicon. When the assembly cools back to room temperature, the carrier will shrink back more and generate a warped system where the chip is bent so that its outward facing surface is convex.

The additional structures in the module assembly, such as the lid, lid seal, and thermal interface materials (TIM), can be used to control this warped state. By coupling the chip and carrier to a stiffer lid, the warp can be controlled. A warped system has more strain and stress in the different materials and can cause failure.

The warp in a typical organic single chip module package can be controlled by the lid, TIM, and lid seal materials. In cases where a low strength TIM material is used, the lid and lid seal materials provide the majority of warpage control.

Design of multi-chip packages also take into account that the package will typically have greater silicon area and can have some level of asymmetry. This can cause additional stress and strain in the TIM interfaces, and especially in regions between the chips which are located farther from structural support of the lid seal. In the case of high performance packages, a popular solution for multi-chip packages has been to use a solder material as the thermal interface for all the chips within the package. This tends to be expensive, however.

Accordingly, there exists a need in the art to overcome the deficiencies and limitations described herein.

SUMMARY

In a first aspect of the invention, there is provided a system for achieving mechanical and thermal stability in a multi-chip package. The system includes plural thermal interface materials arranged between chips and a lid of the multi-chip package.

In a second aspect of the invention, there is provided a method for achieving mechanical and thermal stability in a multi-chip package. The method includes utilizing a lid on a multi-chip package and utilizing plural thermal interface materials on the multi-chip package.

In a third aspect of the invention, there is provided a system for achieving mechanical and thermal stability in a multi-chip package. The system includes a lid, a first thermal interface material bonded to a first surface of the lid, a second thermal interface material bonded to a second surface of the lid, and the lid comprises a step arranged between the first and second thermal interface materials, the first chip is a higher-power chip than the second chip, and/or the second chip is thinned.

In a fourth aspect of the invention, there is provided a method for achieving mechanical and thermal stability in a multi-chip package. The method includes placing a lid on the multi-chip package, placing a first thermal interface material on a first chip, placing a second thermal interface material on a second chip, and one of placing a step in the lid between the first and second thermal interface materials, placing a higher-power chip as the first chip and a lower-power chip as the second chip, and thinning the second chip.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 11 shows another exemplary embodiment of a multi-chip package in accordance with the invention; and FIG. 12 shows another exemplary embodiment of a multi-chip package in accordance with the invention.

DETAILED DESCRIPTION

Figure 1:
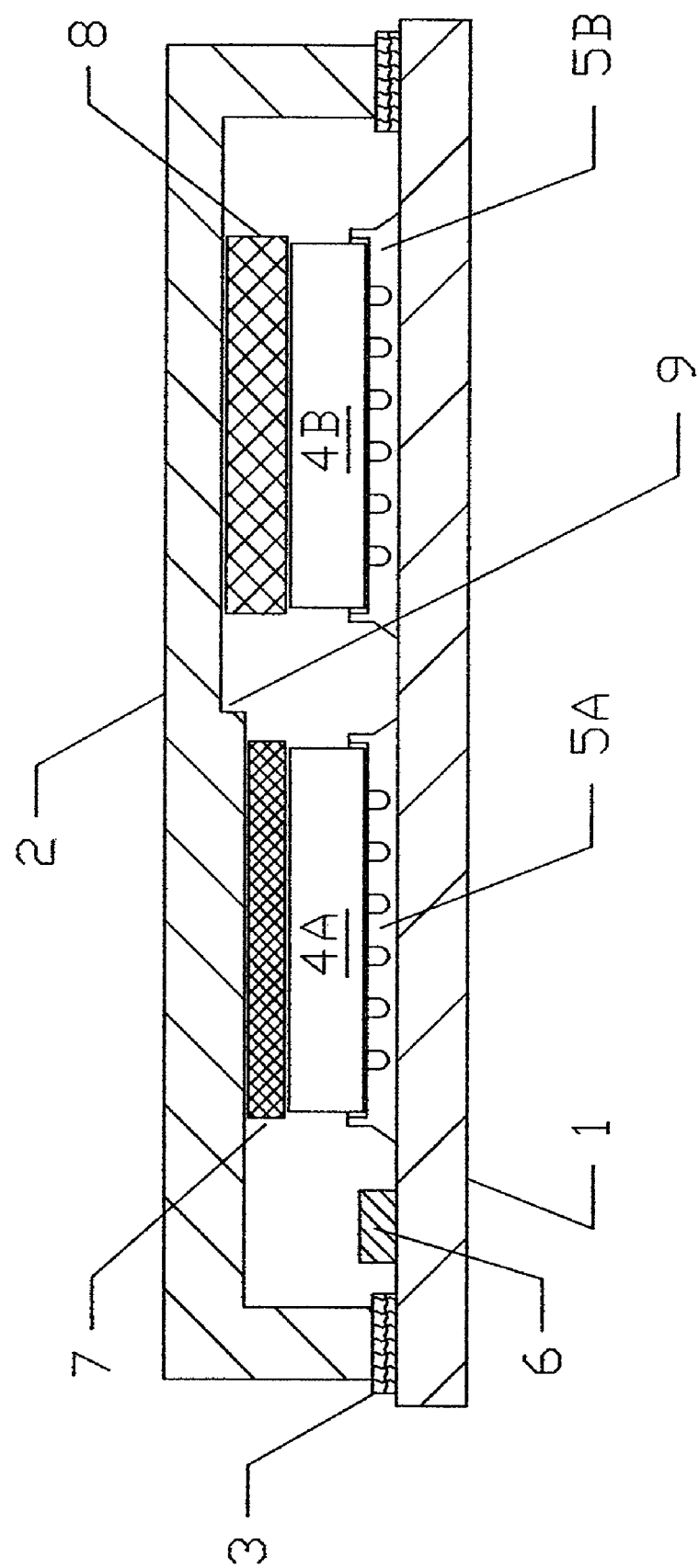
FIG. 1 shows a first exemplary embodiment of a multi-chip package in accordance with the invention.

The invention generally relates to a system and method for achieving mechanical and thermal stability in a multi-chip package utilizing a stepped lid and multiple thermal interface materials. By utilizing multiple TIM materials, the system and method can control package warpage, stress, and TIM degradation within the multi-chip organic package.

According to the invention, the TIM material over or in contact with one or more high-power chips or devices of the multi-chip package can be a thin bond line, high thermal conductivity material. The material can be low strength and preferably provides good thermal performance for the high-power chip(s). The TIM material over or in contact with one or more low-power chips or devices of the multi-chip package can provide lower thermal performance and be more structurally robust, i.e., have a higher modulus and provide better adhesion. The TIM material is also preferably utilized to provide additional structural support within the package and control warpage and stress in the multi-chip package. This TIM material need only provide enough thermal performance required by low-power chips.

According to the invention, the lid utilized on the multi-chip package has at least one step to facilitate TIM bond line control. The stepped lid creates multiple levels to allow thin bond lines to be achieved for the high-power chips. The stepped configuration of the lid also allows control of the capping load which is applied over the high-power chip(s) and accommodates thicker materials and height variations over the low-power chips.

According to the invention, multiple TIM materials, i.e., two or more TIM materials, are utilized in the multi-chip package which have different material properties to provide both thermal performance and package structural stability in the multi-chip organic package. The TIM materials provide additional structural stability versus that provided by the lid seal alone. Furthermore, the TIM material used over the high-power chip(s) can have very good thermal performance and poor structural properties, i.e., a low modulus, whereas the high modulus TIM material over the low power chip(s) can provide structural stiffness. As a result of the configuration of the package according to the invention, the package can overcome the deficiencies discussed above using relatively inexpensive adhesive materials. Moreover, by combining the use of the TIM materials with a stepped lid, the package can utilize a relatively thin bond line over the high-power chip(s). This arrangement also reduces package warpage and stress, prevents degradation of the TIM material over the high-power chip(s), improves BSM coplanarity for BGA or LGA contact, and facilitates asymmetric chip and component placement on a laminate carrier while providing stability for the package. Finally, the TIM material used over the low-power chip(s) can be utilized to provide the desired spacing for thermal and mechanical contact between the high-power chip(s) and the lid.

Figure 2:
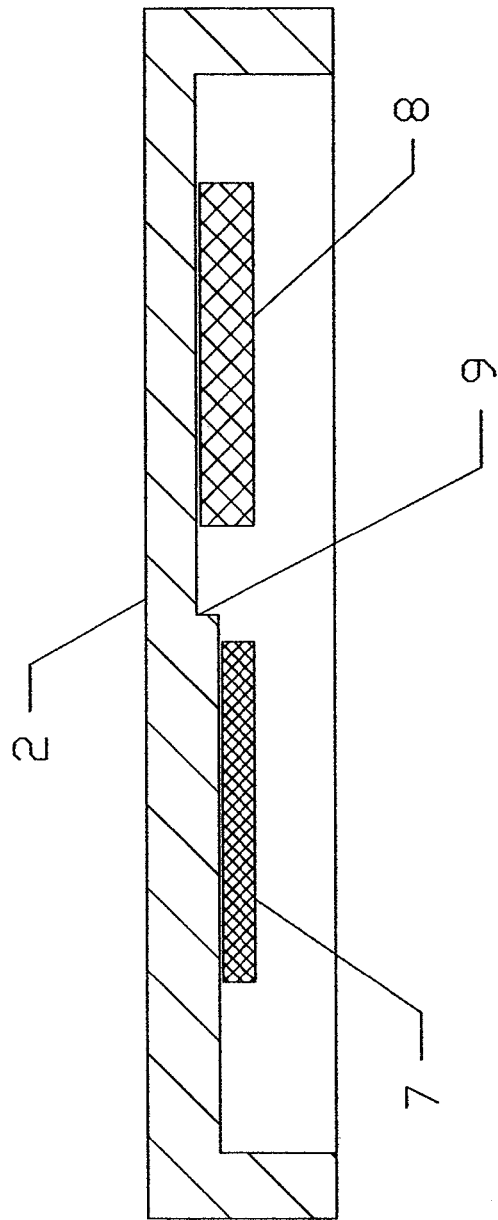
FIG. 2 shows a lid assembly used on the embodiment of FIG. 1 in accordance with the invention.
Figure 3:
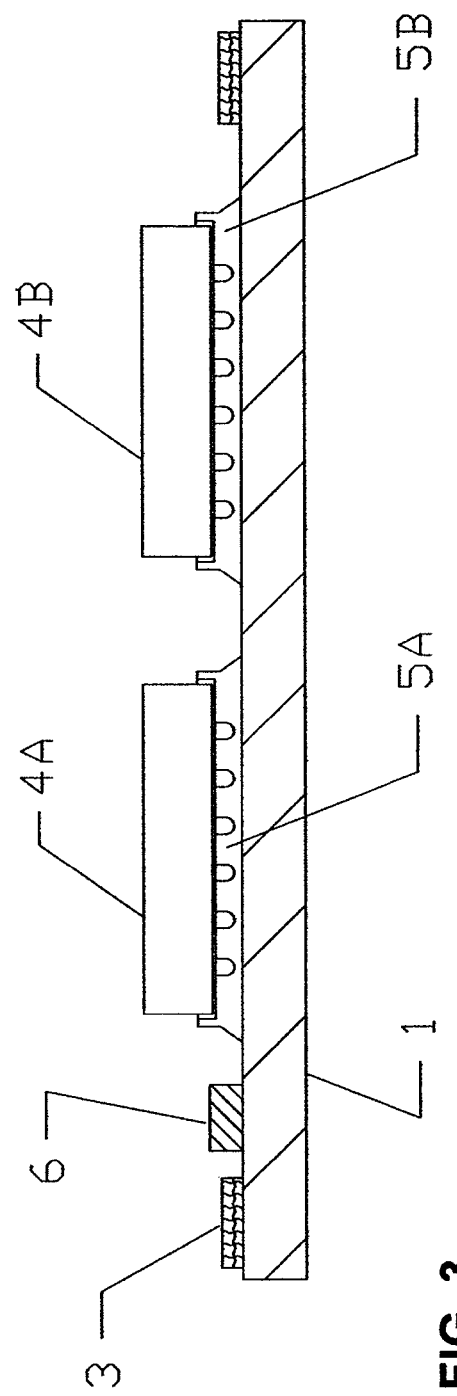
FIG. 3 shows a carrier assembly used on the embodiment of FIG. 1 in accordance with the invention.

FIGS. 1-3 show a non-limiting example of a multi-chip package according to the invention. The multi-chip package includes a carrier 1, a lid 2, a lid seal 3, multiple devices of chips 4A and 4B, chip mounting locations 5A and 5B, one or more other devices 6, TIM materials 7 and 8, and a step 9 formed in the lid 2.

The carrier 1, lid 2, seal 3, chips 4A and 4B, mountings 5A and 5B, and device(s) can be made of conventional materials and/or be conventional devices. By way of non-limiting examples, the carrier 1 can be an FC-PLGA carrier, i.e., a flip chip plastic land grid array substrate, the lid 2 can be a Ni-plated Cu lid, and the seal 3 can be any material conventionally utilized for such seals such as a Silicone adhesive seal band EA-6700. By way of non-limiting example, the seal 3 can be an elastomeric material with a Young's modulus in the range of about 5 to about 100 GPa (giga Pascals). The mounting positions 5A and 5B can have the form of a chip underfill material. The width of the sealing portion of the lid 2 can be between about 2 and 8 mm.

The material for the TIM material 7 can be a thin high performance gel (i.e., having the form of a thin bond line). An example of such a high performance gel includes 7772-4 Gel made by Shin Etsu. An exemplary thickness of the material 7 can be about 25 μm. The material for the TIM material 8 can be a lower performance and higher modulus adhesive (i.e., having the form of a thick bond line relative to the thickness of material 7). An example of such low performance material includes Sylgard (POR) DC-577 made by Dow Corning. By way of non-limiting example, the TIM material 7 can be a material with a Young's modulus that is several orders of magnitude lower than that of the TIM material 8 and also have a thermal conductivity greater than or equal to about 1 W/mK (Watts per meter Kelvin). The TIM material 7 can preferably have a Young's modulus on the order of 10 MPa (mega Pascals) or lower and a conductivity that is greater than about 2.5 W/mK, and can have a thickness in the range of between about 20 and about 100 microns. By way of non-limiting example, the TIM material 8 can be a material with a Young's modulus in the range of about 5 to about 10 GPa such as an elastomeric material, and can have thickness in the range of between about 50 and about 250 or more microns. The material used for the seal 3 can also optionally also be used to form the TIM material 8 over the low-power chip 4B. The thicknesses noted herein for the TIM materials 7 and 8 can, of course, vary depending on a number of factors such as the materials used and the thermal performance required.

With reference to FIG. 3, it can be seen that, prior to securing of the lid 2 onto the carrier 1, the device or chip 4A is mounted to the mounting position 5A and is preferably a high-power chip or device. Examples of such high-power chips include a microprocessor chip with power dissipation that is in the range of between about 40 and about 250 watts. The device or chip 4B is mounted to the mounting position 5B and is preferably a low-power chip or device. Examples of such low-power chips include a low power chip or device that is less than about 10 Watts. The chip 4B can also be, e.g., a memory cache chip that is under about 40 Watts. The device 6 is also attached to the carrier 1 prior to installing of the lid 2.

With reference to FIG. 2, it can be seen that after the TIM materials 7 and 8 are attached to inside surfaces of the lid 2, it can be secured to the carrier 1 via the seal 3 in order to form the package shown in FIG. 1. Preferably, however, the TIM materials 7 and 8 are instead attached to the upper surfaces of the chips 4A and 4B, and then the lid 2 is secured to the carrier 1 via the seal 3 in order to form the package shown in FIG. 1. The lid 2 has a step 9 formed therein which separates two planar surfaces. One of the surfaces will be arranged above chip 4A (see FIG. 1) and it is this surface to which the TIM material 7 is bonded or otherwise attached (see FIG. 2). The other surface is arranged on the opposite side of the step 9, and above chip 4B (see FIG. 1). It is this other surface to which the TIM material 8 is bonded or otherwise attached (see FIG. 2). As a result of the step 9, the thickness of the portion of the lid 2 over the chip 4A is greater than that over the chip 4B. Furthermore, the thickness of the TIM material 8 over chip 4B is greater than the TIM material 7 over the chip 4A. By way of example, the thickness of a portion of the lid 2 over chip 4A can be minimized and the thickness of a portion of the lid 2 over chip 4B can be about 2 mm. The thickness or height of step 9 can be about 100 μm to accommodate the noted thicknesses of the materials 7 and 8.

Preferably, the height of the step 9 is determined based on the desired type and/or thicknesses of the TIM materials 7 and 8. By way of non-limiting example, the height of step 9 can be about 0.1 mm. The TIM materials 7 and 8 are in turn determined based on characteristics, e.g., power, of the devices or chips 4A and 4B and with the aim of achieving mechanical and thermal stability in a multi-chip package and/or overcoming the deficiencies discussed above.

Figure 4:
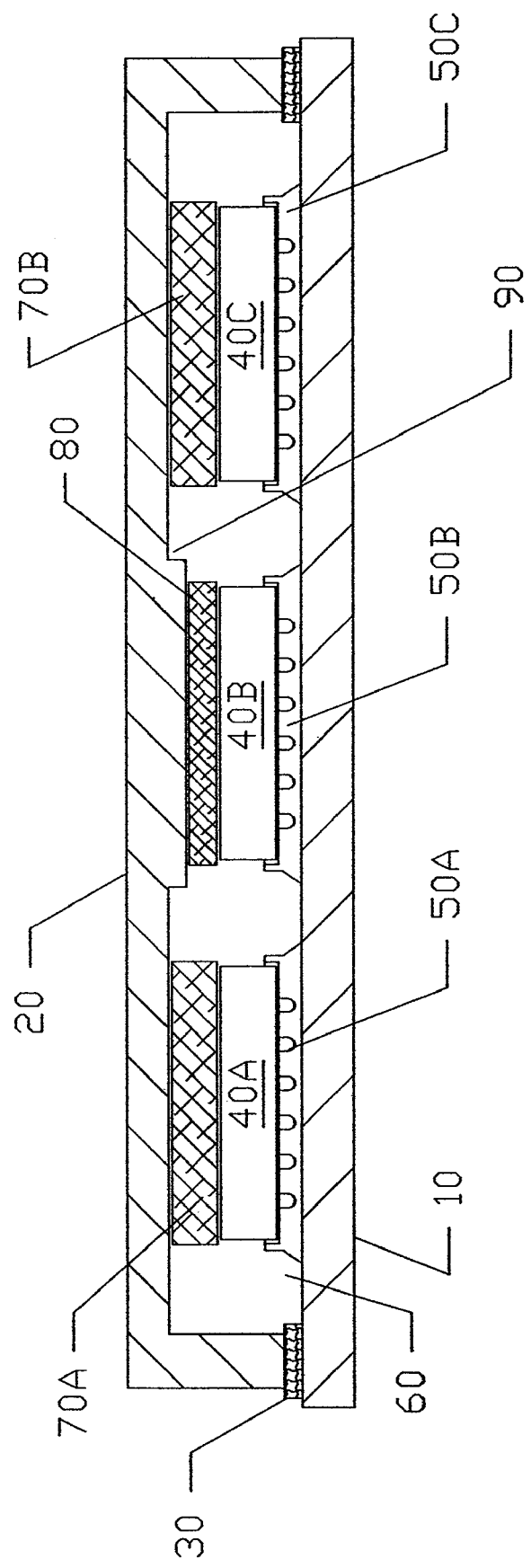
FIG. 4 shows a second exemplary embodiment of a multi-chip package in accordance with the invention.
Figure 5:
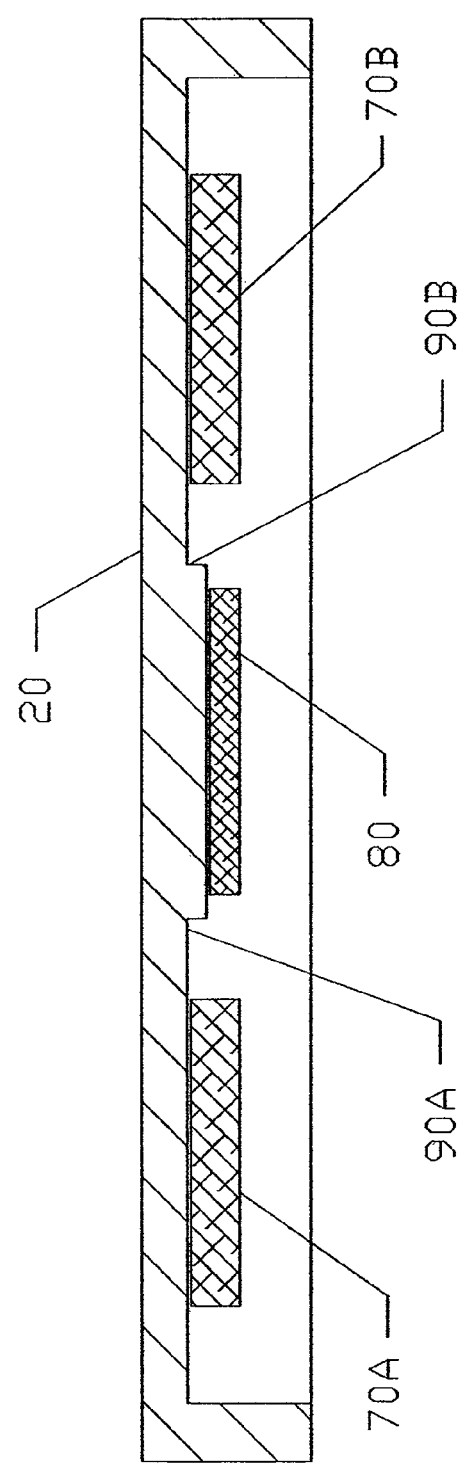
FIG. 5 shows a lid assembly used on the embodiment of FIG. 4 in accordance with the invention.
Figure 6:
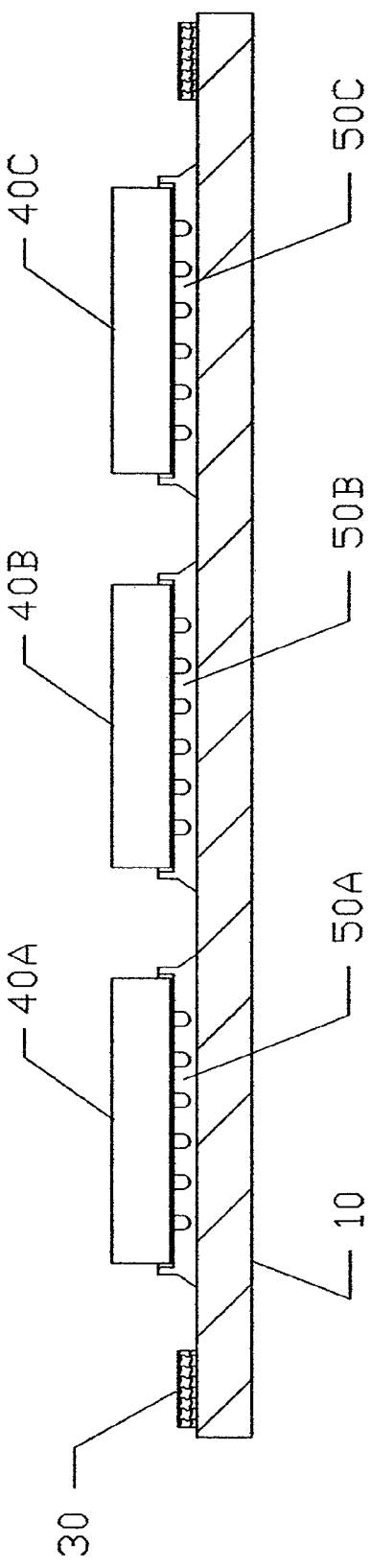
FIG. 6 shows a carrier assembly used on the embodiment of FIG. 4 in accordance with the invention.

FIGS. 4-6 show another non-limiting example of a multi-chip package according to the invention. The multi-chip package includes carrier 10, a lid 20, a lid seal 30, multiple devices of chips 40A, 40B and 40C, chip mounting locations 50A, 50B and 50C, TIM materials 70A, 70B, and 80, and steps 90A and 90B formed in the lid 20.

As with the previous embodiment, the carrier 10, lid 20, seal 30, chips 40A-40C, mountings 50A-50C, and device(s) can be made of conventional materials and/or be conventional devices. By way of non-limiting examples, the carrier 10 can be an FC-PLGA carrier, i.e., a flip chip plastic land grid array substrate, the lid 20 can be a Ni-plated Cu lid, and the seal 30 can be any Silicone-based material conventionally utilized for such seals such as an adhesive. The mounting positions 50A-50C can each have the form of a chip underfill material. The width of the sealing portion of the lid 20 can be between about 2 and 8 mm.

The TIM material 80 can be a thin high performance gel (i.e., having the form of a thin bond line). An example of such a high performance gel includes 7772-4 Gel made by Shin Etsu. An exemplary thickness of the material 80 can be about 25 μm. The material for each TIM material 70A and 70B can be a lower performance and higher modulus adhesive (i.e., having the form of a thick bond line relative to the thickness of material 80). An example of such low performance material includes Sylgard 577 made by Dow Corning. An exemplary thickness of the material 70A and 70B can be about 50 to about 250 microns. The material used for the seal 30 can also optionally be used to form the TIM material 70A and 70B over the low-power chips 40A and 40C.

With reference to FIG. 6, it can be seen that, prior to securing of the lid 20 onto the carrier 10, the device or chip 40B is mounted to the mounting position 50B and is preferably a high-power chip or device. Examples of such high-power chips include those described with reference to the previous embodiment. The devices or chips 40A and 40C are mounted to the mounting positions 50A and 50C, and are each preferably a low-power chip or device. Examples of such low-power chips include those described with reference to the previous embodiment. Although not shown, other devices can also be attached to the carrier 10 prior to installing of the lid 20.

With reference to FIG. 5, it can be seen that after the TIM materials 70A and 70B, and 80 are attached to inside surfaces of the lid 20, it can be secured to the carrier 10 via the seal 30 in order to form the package shown in FIG. 4. Preferably, however, the TIM materials 70A, 70B and 80 are instead attached to the upper surfaces of the chips 40A, 40B and 40C, and then the lid 20 is secured to the carrier 10 via the seal 30 in order to form the package shown in FIG. 4. The lid 20 has two steps 90A and 90B formed therein which separates three planar surfaces. One of the surfaces will be arranged above chip 40A (see FIG. 4), and it is this surface to which the TIM material 70A is bonded or otherwise attached (see FIG. 5). Another of the surfaces will be arranged above chip 40B (see FIG. 4), and it is this surface to which the TIM material 80 is bonded or otherwise attached (see FIG. 5). Still another surface is arranged above chip 40C (see FIG. 4). It is this other surface to which the TIM material 70B is bonded or otherwise attached (see FIG. 5). As a result of the steps 90A and 90B, the thickness of the portion of the lid 20 over the chips 40A and 40C is less than that over the chip 40B. Furthermore, the thickness of the TIM materials 70A and 70B over chips 40A and 40C is greater than the TIM material 80 over the chip 40B. By way of example, the thickness of a portion of the lid 20 over chip 40B can be minimized and the thickness of a portion of the lid 20 over chips 40A and 40C can be about 2 mm. The thickness or height of each step 90A and 90B can be about 100 μm to accommodate the noted thicknesses of the materials 70A and 70B.

Preferably, the height of each step 90A and 90B is determined based on the desired type and/or height of the TIM materials 70A, 70B and 80. By way of non-limiting example, the height of steps 90A and 90B can be about 0.1 mm. The TIM materials 70A, 70B and 80 are in turn determined based on characteristics, e.g., power, of the devices or chips 40A-40C and with the aim of achieving mechanical and thermal stability in a multi-chip package and/or overcoming the deficiencies discussed above.

Figure 7:
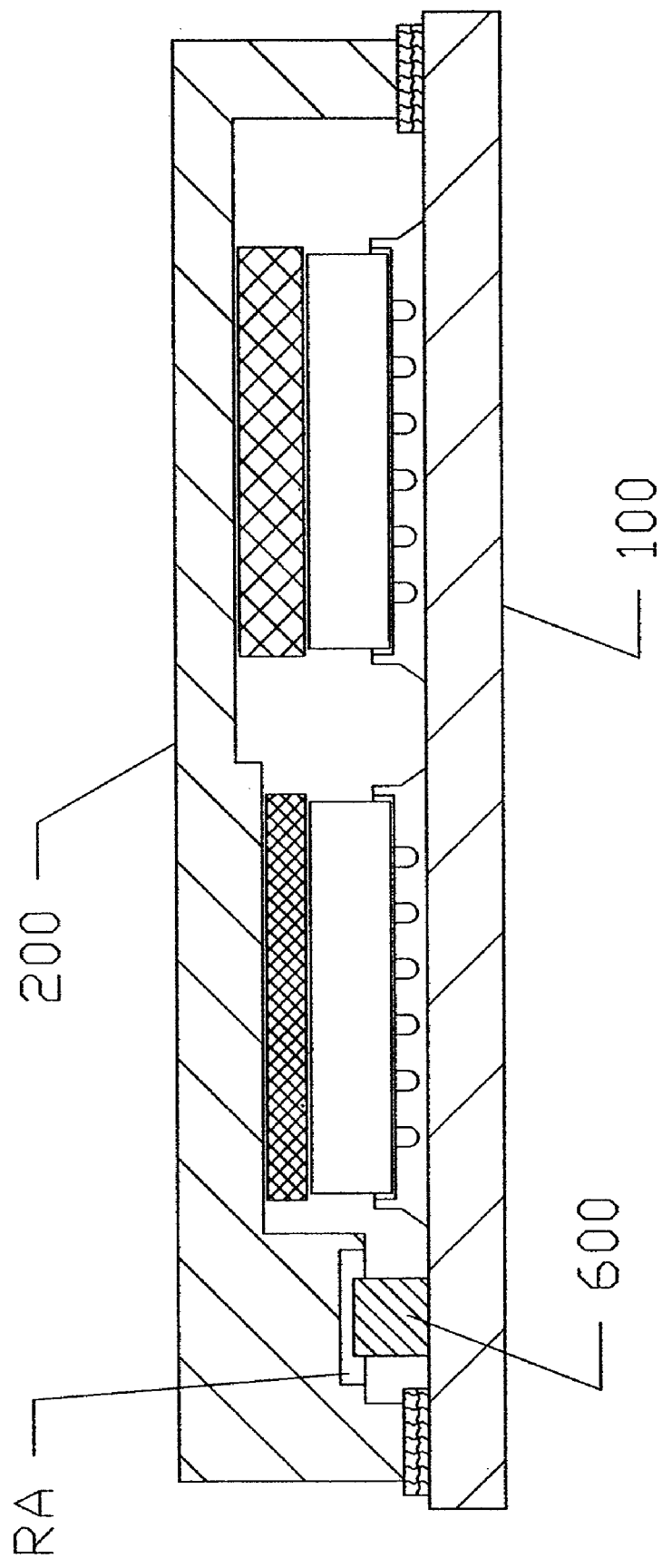
FIG. 7 shows a third exemplary embodiment of a multi-chip package in accordance with the invention.

FIG. 7 shows another non-limiting example of a multi-chip package according to the invention. The multi-chip package is similar to that of FIG. 1 and includes carrier 100, a lid 200, a lid seal, multiple devices of chips, chip mounting locations, as well as one or more other devices 600, TIM materials, and a step formed in the lid 200. However, this embodiment also utilizes a recessed area RA formed in the lid 200 to accommodate the additional device 600. The recessed area RA ensures that a gap or spacing exists between the device 600 and the lid 200 while also providing a reinforced (i.e., thicker) area of the lid 200 over the device 600.

Figure 8:
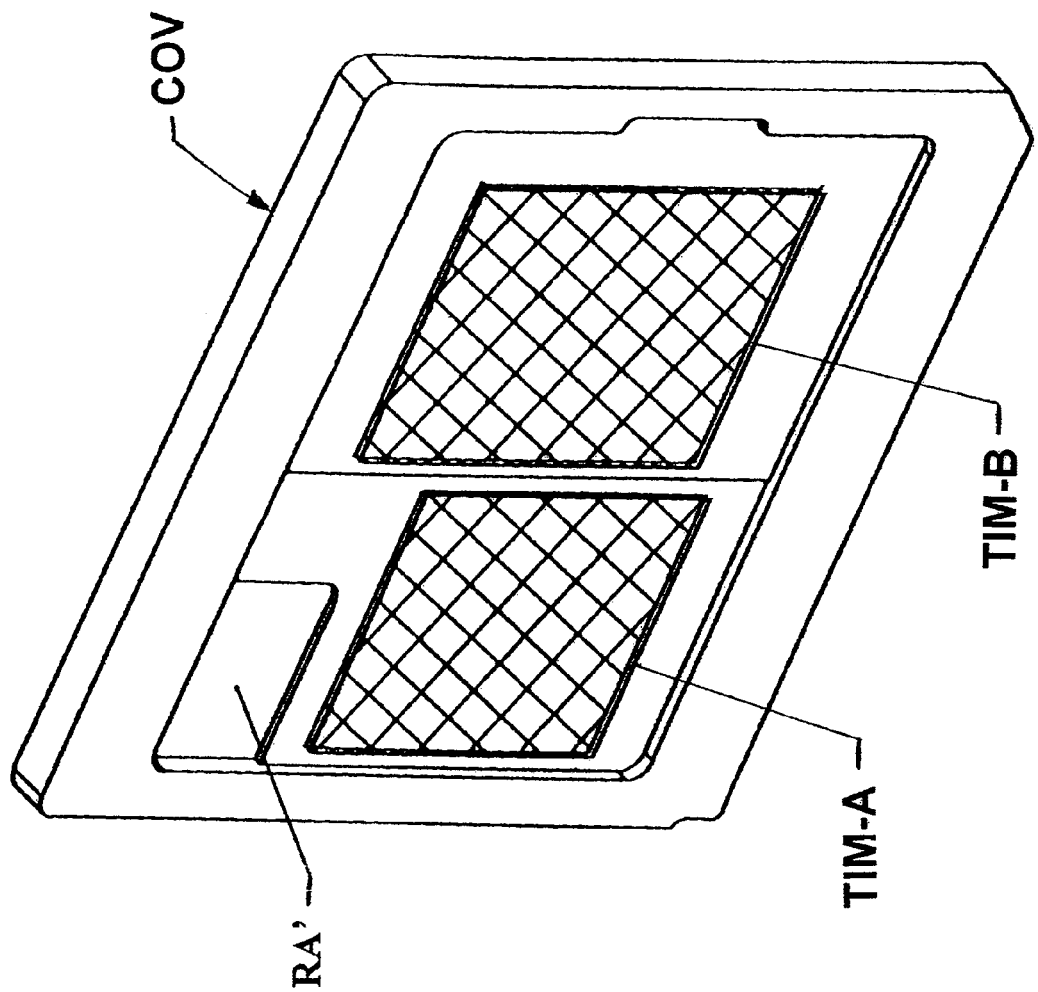
FIG. 8 shows a lid assembly which can be used on a still another embodiment of multi-chip package in accordance with the invention.

FIG. 8 shows another non-limiting example of a lid COV which can be used in a multi-chip package according to the invention. The lid COV can be similar to that used in the embodiment of FIG. 1, and includes TIM materials TIM-A and TIM-B, and a step formed in the lid COV between the TIM materials TIM-A and TIM-B. Preferably, however, the TIM materials TIM-A and TIM-B are attached to the upper surfaces of the chips, and then the lid COV is secured to the carrier via a seal 3 in order to form a package. This embodiment also utilizes a recessed area RA' formed in the lid COV to accommodate an additional device mounted to the carrier (not shown). As in the previous embodiment, the recessed area RA' ensures that a gap or spacing exists between the device and the lid COV.

Figure 9:
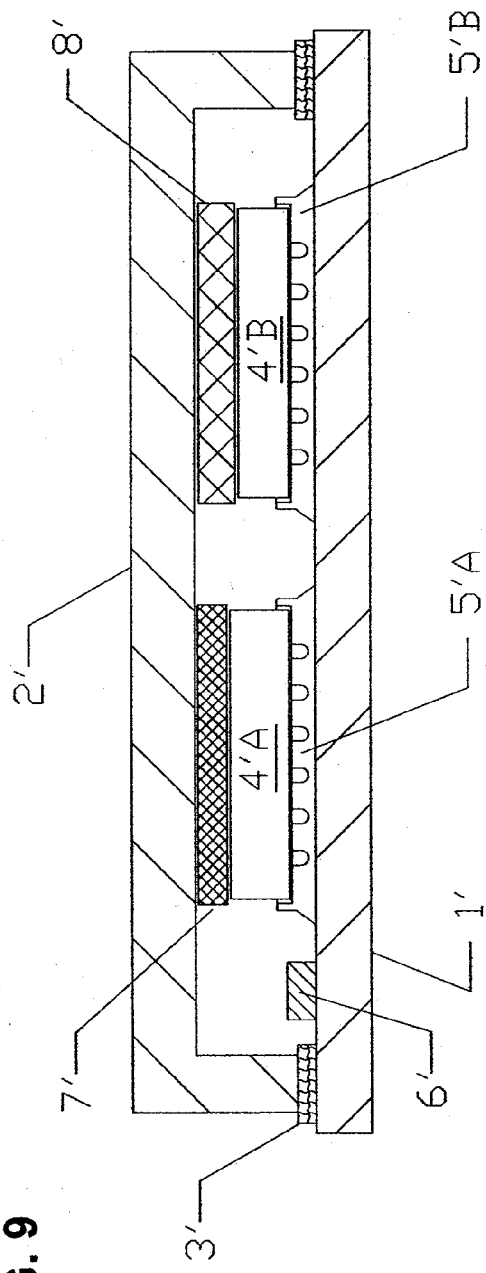
FIG. 9 shows another exemplary embodiment of a multi-chip package in accordance with the invention.

FIG. 9 shows another non-limiting example of a multi-chip package according to the invention. The multi-chip package is similar to that of FIG. 1 except that the lid 2' does not utilize a step, i.e., the lid 2' is a flat lid, i.e., having a planar bottom surface. The package includes a carrier 1', a lid 2', a lid seal 3', multiple devices of chips 4'A and 4'B, chip mounting locations 5'A and 5'B, as well as one or more other devices 6', and TIM materials 7' and 8'. The device or chip 4'A is preferably a high-power chip or device of the type described above. The device or chip 4'B is preferably a low-power chip or device of the type described above. Although not illustrated, the high-power chip or device 4'A will typically be thicker than the low-power chip or device 4'B. The TIM materials 7' and 8' are preferably placed or dispensed upon chips 4'A and 4'B respectively prior to the attachment of the lid 2' to the carrier 1'. Furthermore, the TIM materials 7' and 8' can be materials similar to those described above in, e.g., FIG. 1.

Figure 10:
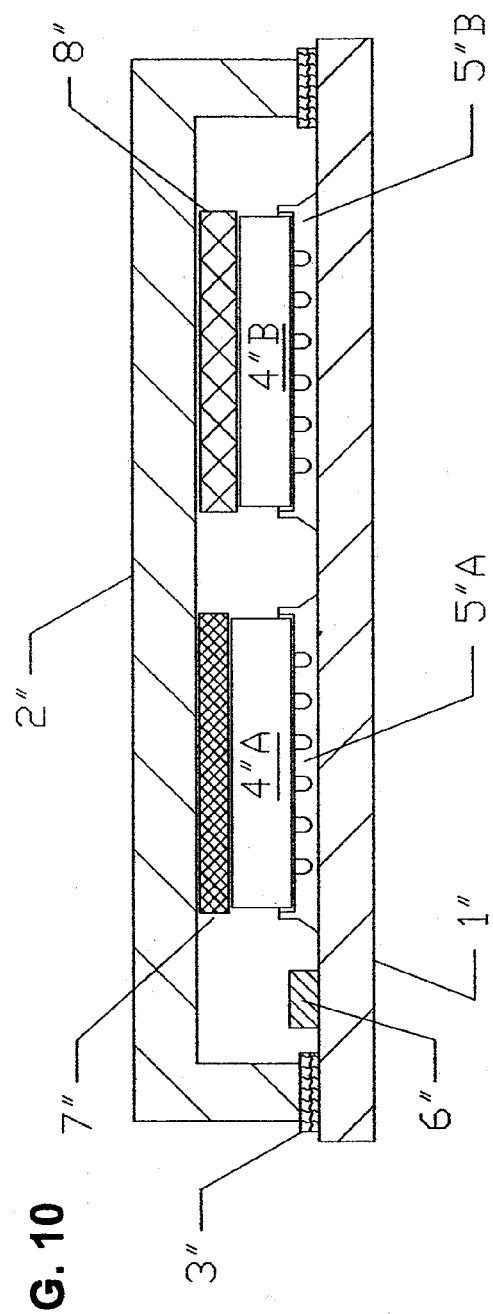
FIG. 10 shows another exemplary embodiment of a multi-chip package in accordance with the invention.

FIG. 10 shows another non-limiting example of a multi-chip package according to the invention. The multi-chip package is similar to that of FIG. 9 in that the lid 2" does not utilize a step, i.e., the lid 2" is a flat lid, i.e., having a planar bottom surface. However, in this embodiment, the lower power chip 4"B is subjected to thinning, i.e., the chip 4"B is subjected to a material removal process which causes its thickness to be reduced to a desired level. This can occur after the chip 4"B is formed or during a previous manufacturing stage such during wafer processing.

The package includes a carrier 1", a lid 2", a lid seal 3", multiple devices of chips 4"A and 4"B, chip mounting locations 5"A and 5"B, as well as one or more other devices 6", and TIM materials 7" and 8". The device or chip 4"A is preferably a high-power chip or device of the type described above. The device or chip 4"B is preferably a low-power chip or device of the type described above. The TIM materials 7" and 8" are preferably placed or dispensed upon the chips 4"A and 4"B respectively prior to the attachment of the lid 2" to the carrier 1". Furthermore, the TIM materials 7" and 8" can be materials similar to those described above in, e.g., FIG. 1.

FIG. 11 shows another non-limiting example of a multi-chip package according to the invention. The multi-chip package is similar to that of FIG. 4 except that the lid 20' does not utilize a step, i.e., the lid 20' is a flat lid. The package includes carrier 10', a lid 20', a lid seal 30', multiple devices of chips 40'A, 40'B and 40'C, chip mounting locations 50'A, 50'B and 50'C, and TIM materials 70'A, 70'B and 80'. The device or chip 40'B is preferably a high-power chip or device of the type described above. The devices or chips 40'A and 40'C are each preferably a low-power chip or device of the type described above. The TIM materials 70'A, 70'B and 80' are preferably placed or dispensed upon the chips 40'A, 40'B and 40'C respectively prior to the attachment of the lid 20' to the carrier 10'. Furthermore, the TIM materials 70'A, 70'B and 80' can be materials similar to those described above in FIG. 9.

FIG. 12 shows another non-limiting example of a multi-chip package according to the invention. The multi-chip package is similar to that of FIG. 11 in that the lid 20" does not utilize a step, i.e., the lid 20" is a flat lid, i.e., having a planar bottom surface. However, in this embodiment, the lower power chips 40"A and 40"C are subjected to thinning, i.e., the chips 40"A and 40"C are each subjected to a material removal process which causes its thickness to be reduced to a desired level. This can occur after the chips 40"A and 40"C are formed or during a previous manufacturing stage such during wafer processing. The package includes carrier 10", a lid 20", a lid seal 30", multiple devices of chips 40"A, 40"B and 40"C, chip mounting locations 50"A, 50"B and 5)"C, and TIM materials 70"A, 70"B and 80"C. The device or chip 40"B is preferably a high-power chip or device of the type described above. The device or chips 40"A and 40"C are preferably a low-power chip or device of the type described above. The TIM materials 70"A, 70"B and 80" are preferably are preferably placed or dispensed upon the chips 40"A, 40"B and 40"C respectively prior to the attachment of the lid 20" to the carrier 10". Furthermore, the TIM materials 70"A, 70"B and 80" can be materials similar to those described above in FIG. 11.

Applicant hereby expressly incorporates by reference the entire disclosure of the Article entitled "Development of a 50 mm Flip Chip Plastic Land Grid Array Package for Server Applications" by Sylvain Quimet et al. presented in a conference of May 30, 2008.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method for achieving mechanical and thermal stability in a multi-chip package, the method comprising:
   utilizing a lid on a multi-chip package; and
   arranging plural thermal interface materials on the multi-chip package, the plural thermal interface materials comprising a first thermal interface material arranged on a first chip, and a second thermal interface material arranged on a second chip, wherein the first thermal interface material has a higher Young's modulus than the second thermal interface material.

2. The method of claim 1, further comprising forming the lid as a stepped lid that covers chips of the multi-chip package.

3. The method of claim 1, wherein the first and second materials are at least one of:
- different thicknesses;
- different materials;
- materials having different thermal properties or conductivities; and
- materials having different physical properties.

4. The method of claim 1, wherein:
the first thermal interface material has a first thickness, a first conductivity and a first elastic modulus;
the second thermal interface material has a second thickness, a second conductivity and a second elastic modulus; and
the second thickness is greater than the first thickness, and the first conductivity is greater than the second conductivity.

5. The method of claim 4, wherein the first thermal interface material is arranged between the first chip and a first surface of the lid and the second thermal interface material is arranged between the second chip and a second surface of the lid.

6. The method of claim 5, wherein at least one of:
the first chip is a higher-power chip than the second chip; and
the second chip is thinned.

7. The method of claim 1, wherein the arranging the first thermal interface material comprises arranging the first thermal interface material to provide structural stiffness to the lid.

8. The method of claim 7, arranging the second thermal interface material comprises providing the second thermal material with higher thermal performance and lower structural stiffness in comparison to the first thermal material.

9. The method of claim 1, wherein the second thermal interface material provides substantially higher adhesion to the lid than the first thermal interface material.

10. The method of claim 9, wherein the first thermal interface material provides substantially higher thermal conductivity to the lid than the second thermal material.

11. The method of claim 10, wherein the arranging the plural thermal interface materials comprises providing the second thermal interface material with a thermal conductivity greater than or equal to about 1 watt per meter Kelvin, a Young's modulus of 10 MPa or lower, a conductivity greater than about 2.5 W/mK, and a thickness in a range of between 20 and 100 microns.

12. The method of claim 11, wherein the arranging the plural thermal interface materials comprises providing the first thermal interface material with a Young's modulus in a range between 5 to 10 GPa, and a thickness in a range between 50 and 250 or more microns.

13. The method of claim 12, further comprising providing a recessed area in the lid that accommodates an additional device, wherein the recessed forms a gap between the additional device and the lid, and the gap is devoid of thermal interface material.

14. A method for achieving mechanical and thermal stability in a multi-chip package comprising:
placing a lid on the multi-chip package;
placing a first thermal interface material on a first chip;
placing a second thermal interface material on a second chip; and
thinning the second chip.

15. The method of claim 14, further comprising providing a recessed area in the lid that accommodates an additional device, wherein the recessed forms a gap between the additional device and the lid, and the gap is devoid of thermal interface material.

16. A method for a multi-chip package including a lid, a high-power chip and a low-power chip, the method comprising:
arranging a first thermal interface material on the high-power chip; and
arranging a second thermal interface material over the low-power chip,
wherein the arranging of the first thermal interface and the second thermal interface provide structural stiffness to the lid.

17. The method of claim 16, wherein the arranging the second thermal interface material comprises, providing the second thermal interface material with a substantially higher Young's modulus and adhesion than the first thermal interface material.

18. The method of claim 17, wherein the arranging the first thermal interface material comprises, providing the first thermal interface material with a substantially higher thermal conductivity than the second thermal interface material.

19. The method of claim 18, wherein the arranging the first thermal interface material comprises providing the first thermal interface material having a thermal conductivity greater than or equal to about 1 watt per meter Kelvin, a Young's modulus of 10 MPa or lower, a conductivity greater than 2.5 W/mK, and a thickness in a range of between 20 and 100 microns.

20. The method of claim 19, wherein arranging the second thermal interface material comprises providing the second thermal interface material with a Young's modulus in a range between 5 to 10 GPa, and having thickness in a range between 50 and 250 microns.

21. The method of claim 20, wherein the arranging of the first thermal interface and the second thermal interface comprises, providing a seal between the lid and a carrier, the seal having a Young's modulus in a range of 5 to 100 GPa.

22. The method of claim 16, further comprising providing a recessed area in the lid that accommodates an additional device, wherein the recessed area forms a gap between the additional device and the lid, and the gap is devoid of thermal interface material.

* * * * *